(12) United States Patent
Marin et al.

(10) Patent No.: US 12,381,029 B2
(45) Date of Patent: Aug. 5, 2025

(54) STEPPED COAX MIL PTHS FOR MODULATING INDUCTANCE WITHIN A PACKAGE

(71) Applicant: Intel Corporation, Santa Clara, CA (US)

(72) Inventors: Brandon C. Marin, Chandler, AZ (US); Krishna Bharath, Phoenix, AZ (US); Haifa Hariri, Phoenix, AZ (US); Tarek A. Ibrahim, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 1165 days.

(21) Appl. No.: 17/033,354

(22) Filed: Sep. 25, 2020

(65) Prior Publication Data

US 2022/0102055 A1    Mar. 31, 2022

(51) Int. Cl.
| | |
|---|---|
| *H01F 27/28* | (2006.01) |
| *H01F 17/00* | (2006.01) |
| *H01F 41/04* | (2006.01) |
| *H01F 41/14* | (2006.01) |
| *H01F 41/32* | (2006.01) |
| *H01L 21/48* | (2006.01) |
| *H01L 23/498* | (2006.01) |
| *H01L 23/64* | (2006.01) |

(52) U.S. Cl.
CPC ..... *H01F 27/2804* (2013.01); *H01F 17/0013* (2013.01); *H01F 41/041* (2013.01); *H01F 41/046* (2013.01); *H01L 21/481* (2013.01); *H01L 21/486* (2013.01); *H01L 23/49827* (2013.01); *H01L 23/645* (2013.01); *H01F 2017/002* (2013.01); *H01F 41/14* (2013.01); *H01F 41/32* (2013.01); *H01L 23/49816* (2013.01); *H01L 23/49822* (2013.01)

(58) Field of Classification Search
CPC ............ H01F 27/2804; H01F 17/0013; H01F 41/041; H01F 41/046; H01F 41/14; H01F 41/32; H01F 2017/002; H01L 21/481; H01L 21/486; H01L 23/49827; H01L 23/645; H01L 23/49816; H01L 23/49822
See application file for complete search history.

(56) References Cited

U.S. PATENT DOCUMENTS

| | | | | |
|---|---|---|---|---|
| 4,680,085 A | * | 7/1987 | Vijan ............... | H01L 27/1214 438/719 |
| 6,007,349 A | * | 12/1999 | Distefano ......... | H05K 3/3436 257/E23.068 |
| 6,033,919 A | * | 3/2000 | Gnade .............. | H01L 28/40 257/E21.018 |

(Continued)

*Primary Examiner* — Brigitte A Paterson
(74) *Attorney, Agent, or Firm* — Schwabe, Williamson & Wyatt P.C.

(57) ABSTRACT

Embodiments disclosed herein include electronic packages with embedded inductors and methods of forming such electronic packages. In an embodiment, the electronic package comprises a package core, and a plated through hole (PTH) through a thickness of the package core. In an embodiment, the electronic package further and a magnetic shell around a perimeter of the PTH, where a height of the magnetic shell is less than the thickness of the package core. In an embodiment, the magnetic shell comprises a substantially vertical sidewall and a bottom surface that is tapered.

19 Claims, 12 Drawing Sheets

(56) References Cited

U.S. PATENT DOCUMENTS

| | | | | |
|---|---|---|---|---|
| 2014/0092574 | A1* | 4/2014 | Zillmann | H01L 23/481 |
| | | | | 29/832 |
| 2014/0097526 | A1* | 4/2014 | Suleiman | H01L 23/49503 |
| | | | | 257/E21.705 |
| 2014/0312397 | A1* | 10/2014 | Cheng | H01L 21/823431 |
| | | | | 257/288 |
| 2019/0274217 | A1* | 9/2019 | Zhang | H05K 3/0026 |
| 2019/0341475 | A1* | 11/2019 | Shu | H01L 21/823857 |
| 2020/0111917 | A1* | 4/2020 | Ramaswamy | H01L 29/7869 |
| 2020/0312633 | A1* | 10/2020 | Rathnasinghe | H01L 21/68721 |
| 2021/0014972 | A1* | 1/2021 | Marin | H01L 24/13 |

\* cited by examiner

STEPPED COAX MIL PTHS FOR MODULATING INDUCTANCE WITHIN A PACKAGE

TECHNICAL FIELD

Embodiments of the present disclosure relate to semiconductor devices, and more particularly to electronic packages with coax metal-inductor loop (MIL) structures where the magnetic shell around the plated through hole (PTH) has a variable height that is less than a total thickness of the package core.

BACKGROUND

Coax metal-inductor loop (MIL) structures include a plated through hole (PTH) through the package substrate core that is surrounded by a magnetic shell. Currently, the mechanisms for changing the inductance of the coax MIL structure are limited. One way to change the inductance is to increase or decrease the thickness of the package core. This increases the inductor height, but there are limits in the Z-height of the core. For example, current limits on Z-height of the core substrate are approximately 400 μm to approximately 1400 μm. Another way to modulate inductance is to change the permeability (μ) of the magnetic material. However, optimization of the permeability is extremely difficult from a materials development standpoint. Inductance may also be modulated by changing the thickness of the copper of the PTH and/or increasing the volume of the magnetic material around the PTH. Increasing the copper thickness or the volume of the magnetic material requires a larger footprint, which limits the inductance density per unit area.

EMBODIMENTS OF THE PRESENT DISCLOSURE

Figure 1A:
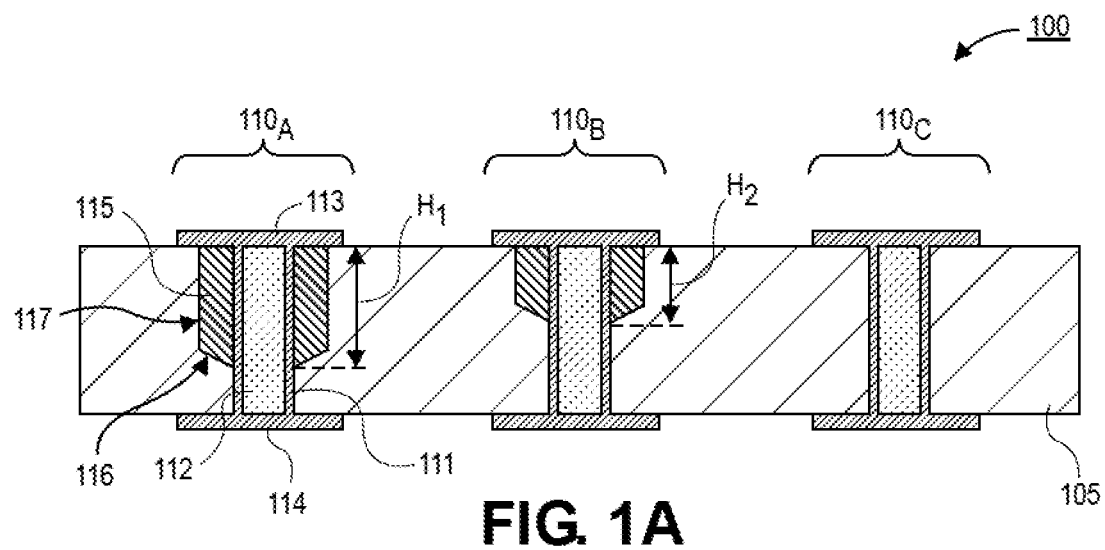
FIG. 1A is a cross-sectional illustration of a package core with a plated through hole (PTH) and a pair of coax metal-inductor loop (MIL) structures with variable magnetic shell heights, in accordance with an embodiment.

Described herein are electronic packages with coax metal-inductor loop (MIL) structures where the magnetic shell around the plated through hole (PTH) has a variable height that is less than a total thickness of the package core, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, currently available mechanisms for modulating the inductance of a coax metal-inductor loop (MIL) structure are limited. Accordingly, embodiments disclosed herein provide coax MIL structures that allow for variable magnetic material heights. As such, the inductance of the coax MIL structure may be any inductance level between the minimum (i.e., where no magnetic shell is used) to a maximum (i.e., where the magnetic shell has the same height as the plated through hole (PTH)). Embodiments disclosed herein provide fine control of the height of the magnetic shell due to improvements in the control of drilling depth accuracy. For example, drilling processes described herein may have an accuracy of approximately ±50 μm or better, or approximately ±10 μm or better, depending on the drill bit size. The drill bit size can range from 100 μm to 500 μm, the large the drill bit, the better than accuracy.

The improved drilling depth accuracy also allows for improved coax MTh structures. Whereas existing coax MIL structures are limited to the package core, embodiments disclosed herein allow for the height of the coax MTh structure to extend into the routing layers above the package core. As such, taller inductors are provided, and allow for increased inductance. Forming the coax MIL structures through the routing layers is enabled by a blind drilling process. Due to the precise control of the drill depth, the drilled openings are capable of landing on an underlying pad without the risk of punching through the pad.

In addition to the non-uniform magnetic shell heights, embodiments disclosed herein are distinguishable from existing coax MTh structures due to the resulting shape of the magnetic shell. Since the drill depth for the opening of the magnetic shell does not pass completely through the package core, a discernable taper is provided along a bottom surface of the magnetic shell. The taper is directed towards the PTH. That is, and outer surface of the magnetic shell is shorter than an inner surface of the magnetic shell (i.e., the surface of the magnetic shell contacting the copper).

Referring now to FIG. 1A, a cross-sectional illustration of an electronic package 100 is shown, in accordance with an embodiment. In an embodiment, the electronic package 100 comprises a package core 105. The package core 105 may be any suitable material utilized for cores in the semiconductor packaging industry. For example, the package core 105 may comprise a fiber reinforced dielectric material or the like. In FIG. 1A only the package core 105 is shown. However, it is to be appreciated that routing layers (e.g., insulating layers with conductive traces, vias, pads, etc.) may be provided above and below the package core 105. In an embodiment, the package core 105 may have a thickness between approximately 1 mm and approximately 2.5 mm.

In an embodiment, a plurality of coax MIL structures 110A-C are provided in the package core 105. Each of the coax MIL structures 110A-C may comprise a conductive PTH 111 that passes through a thickness of the package core 105. The PTHs 111 may be filled with any suitable insulating layer 112. In an embodiment, a first pad 113 may be disposed over a top surface of the PTH 111, and a second pad 114 may be disposed over a bottom surface of the PTH 111.

In the illustrated embodiment, the coax MIL structures 110A-C each have a different inductance. For example, the first coax MIL structure 110A has a first inductance, the second coax MTh structure 110B has a second inductance, and the third coax MTh structure 110C has a third inductance. The first inductance is greater than the second inductance, and the second inductance is greater than the third inductance. The first inductance is higher than the second inductance because a height H1 of the magnetic shell 115 in the first coax MTh structure 110A is greater than a height H2 of the magnetic shell 115 in the second coax MIL structure 110B. Similarly, the second inductance is higher than the third inductance because the third coax MIL structure 110C does not include any magnetic shell 115. Since the third coax MIL structure 110C does not include any magnetic shell 115, the third structure 110C may simply be referred to as a plated through hole in some embodiments.

In an embodiment, the magnetic shells 115 illustrated in FIG. 1A have a height H1 and H2 that is less than a thickness of the package core 105. That is, the magnetic shells 115 do not extend entirely along a length of the PTHs 111. In an embodiment, a first end of the PTH 111 is surrounded by the magnetic shell 115, while a second end of the PTH 111 is directly contacting the package core 105. In the illustrated embodiment, the top portion of the PTH 111 is surrounded by and contacts the magnetic shell 115, and the bottom portion of the PTH 111 contacts the package core 105.

In an embodiment, the drilling process used to form the openings for the magnetic shells 115 results in a distinctive taper at an end of the magnetic shell 115. For example, a first surface 117 of the magnetic shell 115 is substantially vertical, and a second surface 116 (e.g., the bottom surface) of the magnetic shell 115 has a taper that extends towards the PTH 111. The taper of the second surface 116 results in an interior surface of the magnetic shell 115 (i.e., the surface contacting the PTH 111) being taller than an outer surface of the magnetic shell 115 (i.e., the first surface 117 contacting the package core 105).

In an embodiment, the inductance of the coax MIL structures 110 have the ability to be finely tuned to provide a desired inductance level. The fine tuning is enabled by the use of high precision drilling for the openings for the magnetic shells 115. For example, drilling accuracy may be approximately ±50 μm or better, or approximately ±10 μm or better. For a standard 1 mm thick package core 105, this results in an accuracy of approximately 5% or better, or approximately 1% or better.

Figure 1B:
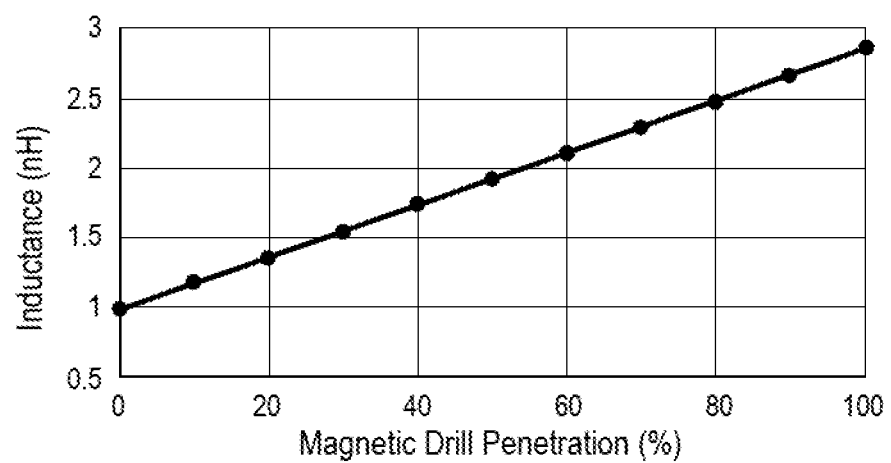
FIG. 1B is a graph that charts the inductance of the coax MIL structure versus the magnetic drill penetration percentage, in accordance with an embodiment.

Referring now to FIG. 1B, a graph of inductance versus magnetic drill depth penetration percentage is shown, in accordance with an embodiment. At 0% the coax MIL structure 110 has no magnetic shell 115, and at 100% the coax MTh structure 110 has a magnetic shell 115 that has a height equal to the thickness of the package core 105. As shown, a linear increase in the inductance is provided between the 0% condition and the 100% condition. The high precision of the drilling allows for the inductance to be tuned to any inductance target between the two extremes. In the particular embodiment depicted in FIG. 1B, the inductance of the coax MIL structure 110 may be between approximately 1.0 nH and approximately 100 nH.

Referring now to FIGS. 2A-2F, a series of cross-sectional illustrations depicting a process for forming coax MIL structures in a package core 205 is shown, in accordance with an embodiment.

Figure 2A:
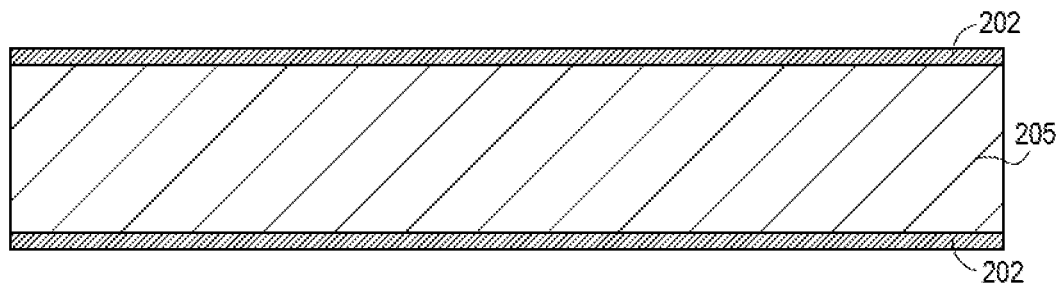
FIGS. 2A-2F are cross-sectional illustrations depicting a process for fabricating coax MIL structures with variable magnetic shell heights, in accordance with an embodiment.

Referring now to FIG. 2A, a cross-sectional illustration of a package core 205 is shown, in accordance with an embodiment. The package core 205 may be any suitable core material, such as a fiber reinforced dielectric material. In an embodiment, the package core 205 may include a conductive layer 202 (e.g., copper) above and below the package core 205.

Figure 2B:
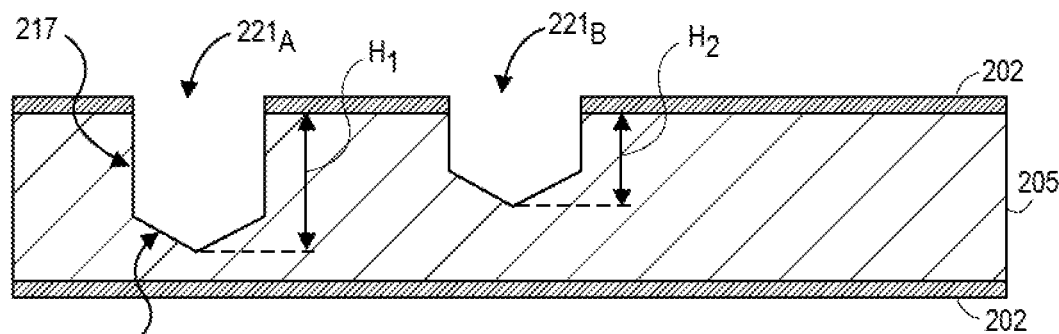

Referring now to FIG. 2B, a cross-sectional illustration of the package core 205 after magnetic shell openings 221A and 221B are drilled into the package core 205 is shown, in accordance with an embodiment. In an embodiment, the magnetic shell openings 221A and 221B may comprise a substantially vertical sidewall 217 and a tapered bottom surface 216. The tapered bottom surface 216 may have a V-shape when viewed in a cross-section, such as the cross-section shown in FIG. 2B.

In an embodiment, the magnetic shell openings 221A and 221B may have heights H1 and H2, respectively. In the illustrated embodiment, the height H1 is greater than the height H2. This will result in the coax MIL structure at the opening 221A having a higher inductance than the coax MIL structure at the opening 221B. However, it is to be appreciated that in other embodiments, the heights H1 and H2 may be substantially the same. In yet another embodiment, additional openings (not shown) with heights H different than H1 and H2 may be provided in order to provide coax MIL structures with different inductances.

Figure 2C:
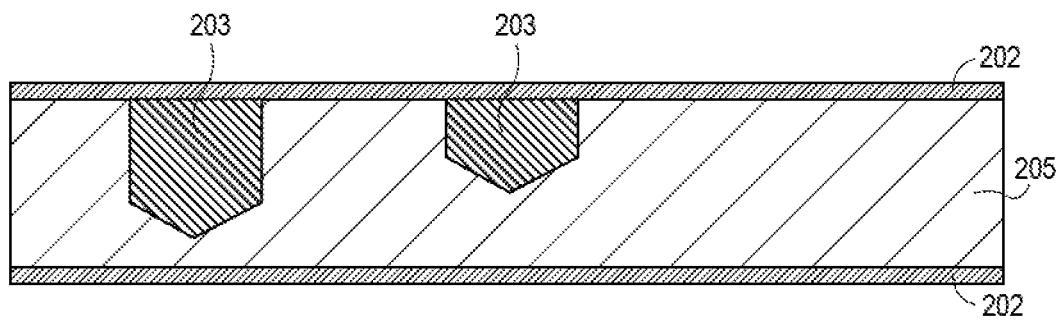

Referring now to FIG. 2C, a cross-sectional illustration of the package core 205 after a magnetic material 203 is disposed in the openings 221A and 221B is shown, in accordance with an embodiment. The magnetic material 203 may be any suitable magnetic material. For example, the magnetic material may include an epoxy filled with magnetic particles. As shown, the magnetic material 203 substantially fills the openings 221A and 221B. In an embodiment, a conductive layer 202, such as copper may be provided above the magnetic materials 203. The magnetic materials may be covered in order to protect the magnetic material 203 from damage during subsequent processing operations.

Figure 2D:
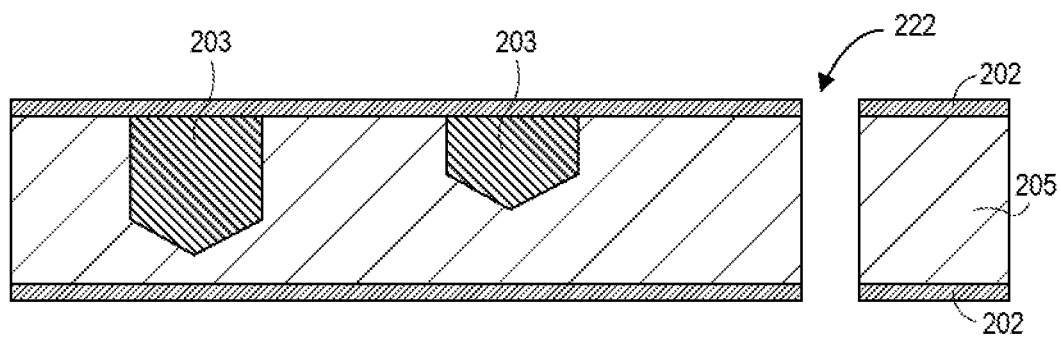

Referring now to FIG. 2D, a cross-sectional illustration of the package core 205 after a through hole 222 is formed through the package core 205 is shown, in accordance with an embodiment. In an embodiment, the through hole 222 may be formed with a drilling process. The through hole 222 may be cleaned with a desmear process. The desmear process may not be compatible with the magnetic material 203. As such, the magnetic material 203 remains covered during the desmear process.

Figure 2E:
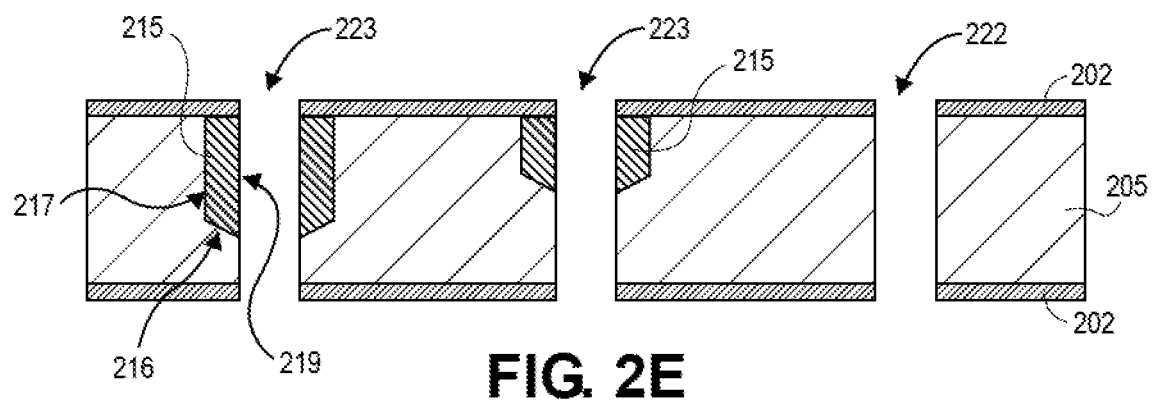

Referring now to FIG. 2E, a cross-sectional illustration of the package core 205 after through holes are drilled through the magnetic material 203 is shown, in accordance with an embodiment. In an embodiment, the drilled through holes 223 may be substantially centered with the magnetic material 203. Removal of a center portion of the magnetic material 203 results in the formation of magnetic shells 215. The magnetic shells 215 include an inner surface 219, an outer surface 217, and a bottom surface 216. In an embodiment, the inner surface 219 and the outer surface 217 are substantially vertical, and the bottom surface 216 is tapered. After drilling the through holes 223, the inner surface 219 and exposed portions of the package core 205 may be cleaned with a high pressure water rinse.

Figure 2F:
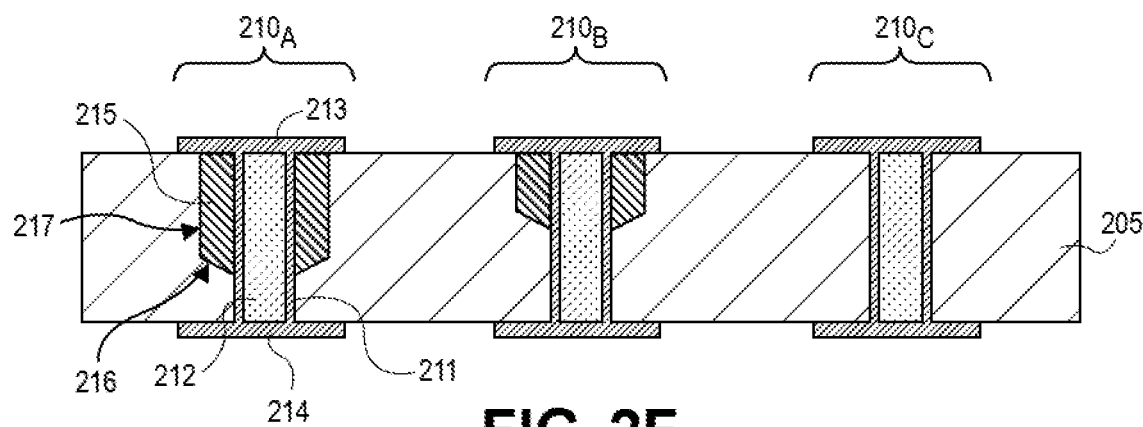

Referring now to FIG. 2F, a cross-sectional illustration of the package core 205 after completion of the coax MTh structures 210 is shown, in accordance with an embodiment. In an embodiment, the through holes 223 and 222 may be lined with a conductive layer (e.g., copper) to provide PTHs 211. The remainder of the through holes 223 and 222 may be filled with an insulative plug 212. In an embodiment, pads 213 and 214 may be provided above and below the PTHs 211.

As shown, three coax MIL structures 210A-C are provided in FIG. 2F. The first coax MTh structure 210A has a magnetic shell 215 with a height that is greater than the height of the magnetic shell 215 of the second coax MTh structure 210B. As such, the inductance of the first coax MIL structure 210A is greater than an inductance of the second coax MIL structure 210B. The third coax MIL structure 210C does not include a magnetic shell 215. In some embodiments, since there is no magnetic shell 215, the third structure 210C may be referred to simply as a plated through hole.

After formation of the coax MIL structures 210, processing of the package core 205 may continue with the addition of routing layers (not shown) above and below the package core 205. A die may also be connected to the electronic package, where the die is electrically coupled to the coax MIL structures 210 through the routing layers.

In the embodiments described above, the coax MTh structures 110/210 are limited to being formed in the package core 105/205. However, advances in drill depth accuracy allow for coax MTh structures to be extended into the routing layers above the package core. As such, the height of the inductor is increased. This enables coax MIL structures with an even higher inductance.

Figure 3A:
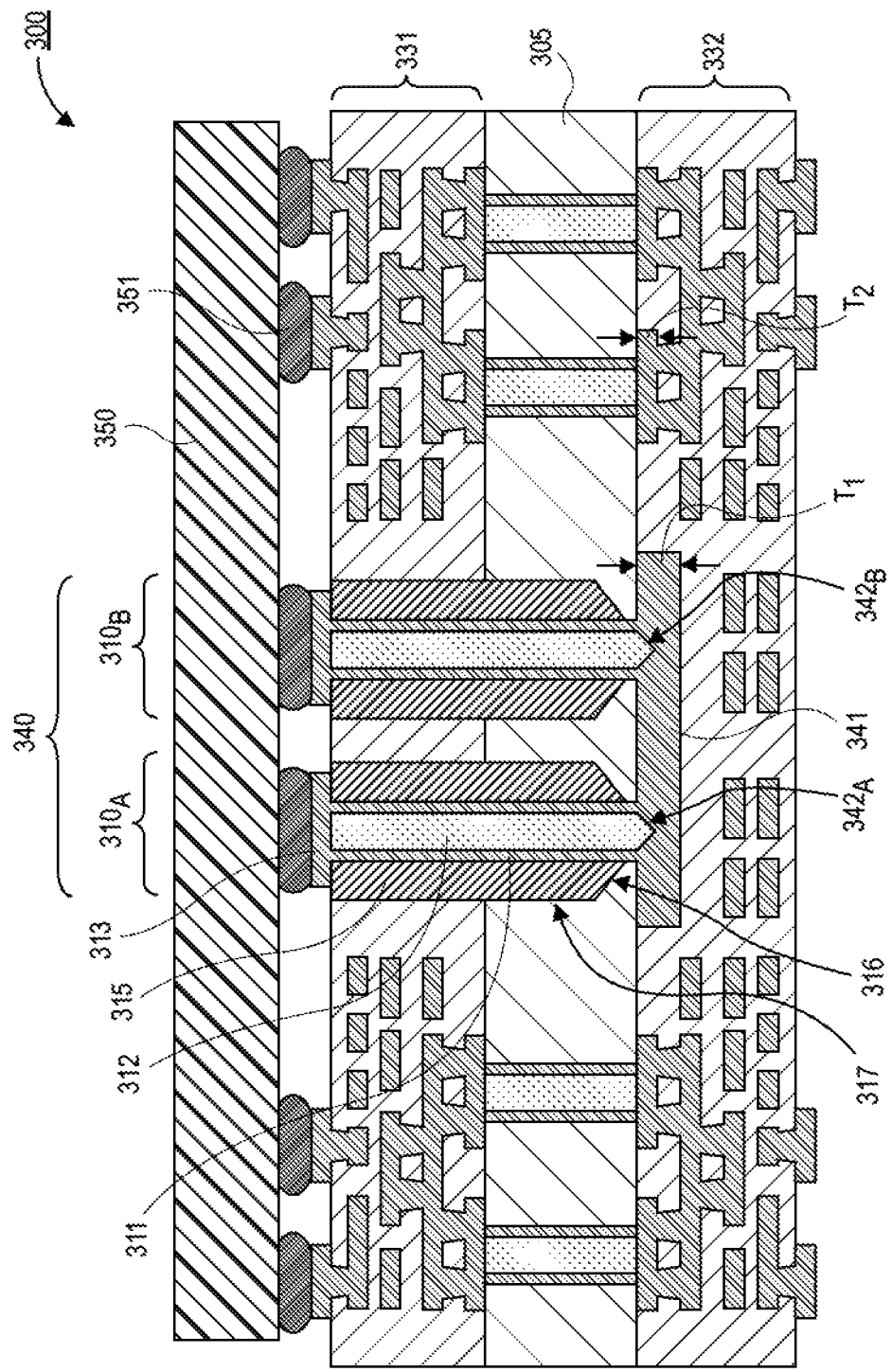
FIG. 3A is a cross-sectional illustration of an electronic package with an inductor loop comprising a pair of coax MIL structures that pass through a package core and routing layers, in accordance with an embodiment.

Referring now to FIG. 3A, a cross-sectional illustration of an electronic package 300 is shown, in accordance with an embodiment. In an embodiment, the electronic package 300 comprises a package core 305 with first routing layers 331 above the package core 305 and second routing layers 332 below the package core 305. The package core 305 may be any suitable core material, such as a fiber reinforced dielectric. The first routing layers 331 and the second routing layers 332 may include dielectric layers and conductive routing (e.g. pads, traces, vias, etc.).

In an embodiment, the electronic package 300 comprises an inductor loop 340. The inductor loop 340 may include a first coax MIL structure 310A and a second coax MTh structure 310B. Pads 313 and interconnects 351 connect the first coax MTh structure 310A and the second coax MIL structure 310B to a die 350. In an embodiment, each of the coax MTh structures 310 include a PTH 311 and a magnetic shell 315 surrounding at least a portion of the PTH 311. The percentage of the PTH 311 surrounded by the magnetic shell 315 may be modulated to provide a desired inductance of the inductor loop 340. In an embodiment, the interiors of the PTHs 311 are filled with a plug material 312. In an embodiment, the PTHs 311 and the magnetic shell 315 may have a height that extends through a thickness of the first routing layers 331 and into the package core 305. In the illustrated embodiment, the PTHs 311 may extend entirely through the package core 305.

In an embodiment, the magnetic shells 315 may have an outer surface 317 that is substantially vertical, and a bottom surface 316 that is tapered. The tapered bottom surface 316 is a characteristic taper resulting from a drilling process, as will be described in greater detail below. In an embodiment, the tapered bottom surface 316 results in the outer surface 317 being shorter than an inner surface of the magnetic shell (i.e., the surface of the magnetic shell 315 contacting the PTH 311). In an embodiment, the magnetic shell 315 surrounds a first end (i.e., the top) of the PTH 311, and a second end (i.e., the bottom) of the PTH 311 is directly contacted by the package core 305. The percentage of the PTH 311 that is contacted by the package core 305 may be increased or decreased in order to modulate the inductance of the coax MIL structures 310.

In an embodiment, the first coax MIL structure 310A is electrically coupled to the second coax MTh structure 310B by a trace 341 in the second routing layers 332 below the package core 305. In an embodiment, the trace 341 has a first thickness T1. The first thickness T1 may be greater than the thickness T2 of other traces or pads in the second routing layers 332. The increased thickness T1 allows for a larger degree of drill depth variation without the risk of completely punching through the trace 341. In an embodiment, the first thickness T1 may be between approximately 20 μm and approximately 40 μm. In a particular embodiment, the trace 341 may have a thickness that is approximately 35 μm.

In an embodiment, the trace 341 may include a notch 342 below each PTH 311. The notches 342A and 342B may be the result of a drilling process used to drill out a core of the magnetic shells 315. The notches 342A and 342B may be characteristic profiles of a drilling process. For example, as shown in the cross-section of FIG. 3A, the notches 342A and 342B may be V-shaped notches. In an embodiment, the plug material 312 may have a pointed end (i.e., a pointed bottom end) as a result of the notches 342A and 342B.

Figure 3B:
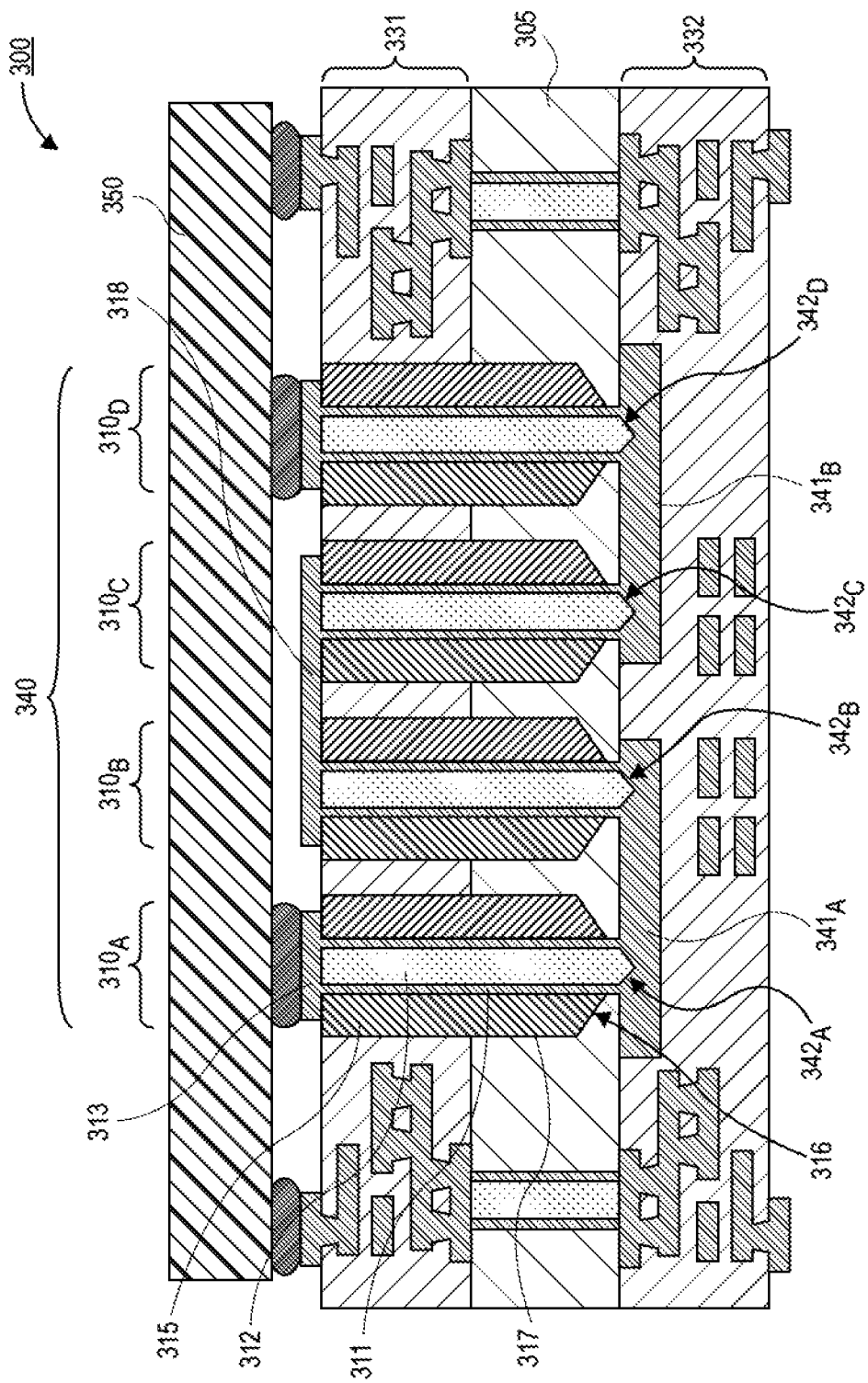
FIG. 3B is a cross-sectional illustration of an electronic package with a multiple loop inductor comprising four coax MIL structures that pass through a package core and routing layers, in accordance with an embodiment.

Referring now to FIG. 3B, a cross-sectional illustration of an electronic package 300 is shown, in accordance with an additional embodiment. In an embodiment, the electronic package 300 in FIG. 3B is substantially similar to the electronic package 300 in FIG. 3A, with the exception that the inductor loop 340 comprises a pair of loops in order to provide even more inductance to the die 350.

In an embodiment, the inductor loop 340 may comprise a first coax MIL structure 310A, a second coax MTh structure 310B, a third coax MIL structure 310C, and a fourth coax MIL structure 310D. The first coax MIL structure 310A is electrically coupled to the second coax MIL structure 310B by a first trace 341A in the second routing layers 332. The second coax MIL structure 310B is electrically coupled to the third coax MTh structure 310C by a second trace 318 above (or in) the first routing layers 331. The third coax MIL structure 310C is electrically coupled to the fourth coax MTh structure 310D by a third trace 341B in the second routing layers 332.

In the illustrated embodiment, the magnetic shells 315 of the coax MTh structures 310A-D are substantially uniform. As such, the inductance of each coax MIL structure 310A-D is substantially the same. However, in other embodiments, the magnetic shells 315 may have different heights, and provide different inductances. As such, the overall inductance of the inductor loop 340 can be selectively tuned to a desired inductance level.

In an embodiment, the individual coax MIL structures 310A-D may be substantially similar to the coax MIL structures 310A-B described with respect to FIG. 3A. For example, the coax MTh structures 310A-D have a substantially vertical outer surface 317 and a tapered bottom surface 316. Additionally, the first trace 341A and the third trace 341B may have notches 342A-D.

Referring now to FIGS. 4A-4J, a series of cross-sectional illustrations depicting a process for forming an inductor loop using coax MTh structures similar to those described in FIGS. 3A and 3B is shown, in accordance with an embodiment.

Figure 4A:
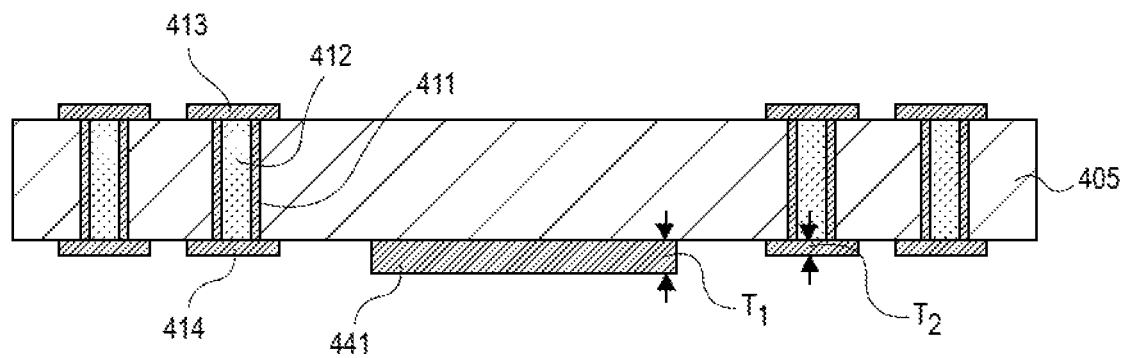
FIGS. 4A-4J are cross-sectional illustrations depicting a process for fabricating coax MIL structures through routing layers and a package core, in accordance with an embodiment.

Referring now to FIG. 4A, a cross-sectional illustration of a package core 405 is shown, in accordance with an embodiment. In an embodiment, the package core 405 may be a fiber reinforced dielectric material. The package core 405 may have a thickness between approximately 0.4 mm and 1.4 mm. In an embodiment, a plurality of PTH vias 411 are provided through a thickness of the package core 405. Pads 413 and 414 may be provided over the PTHs 411. In an embodiment a first trace 441 may be disposed over a bottom surface of the package core 405. The first trace 441 may have a first thickness T1 that is greater than a second thickness T2 of the pads 414. For example, the first thickness T1 may be between approximately 20 μm and 40μ. In a particular embodiment, the first thickness T1 may be approximately 35 μm.

Figure 4B:
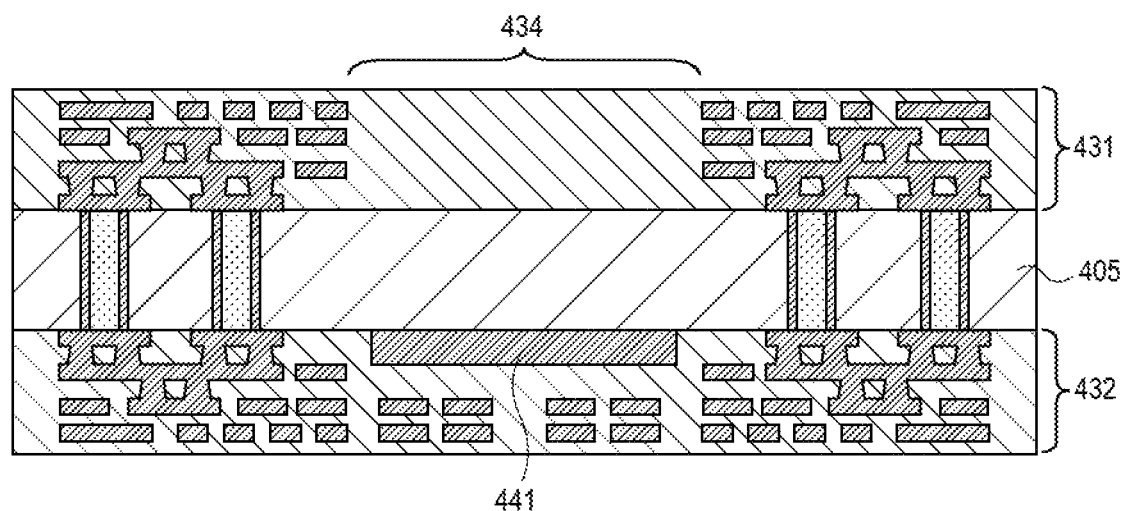

Referring now to FIG. 4B, a cross-sectional illustration of the package core 405 after a plurality of first routing layers 431 and a plurality of second routing layers 432 are disposed over the top and bottom surfaces of the package core 405 is shown, in accordance with an embodiment. In an embodiment, the first routing layers 431 and the second routing layers 432 may be dielectric layers with conductive traces, pads, vias formed therein or thereon. In an embodiment, a voided region 434 of the first routing layers 431 may be provided above the first trace 441. The voided region 434 is the location where the coax MIL structures will be fabricated.

Figure 4C:
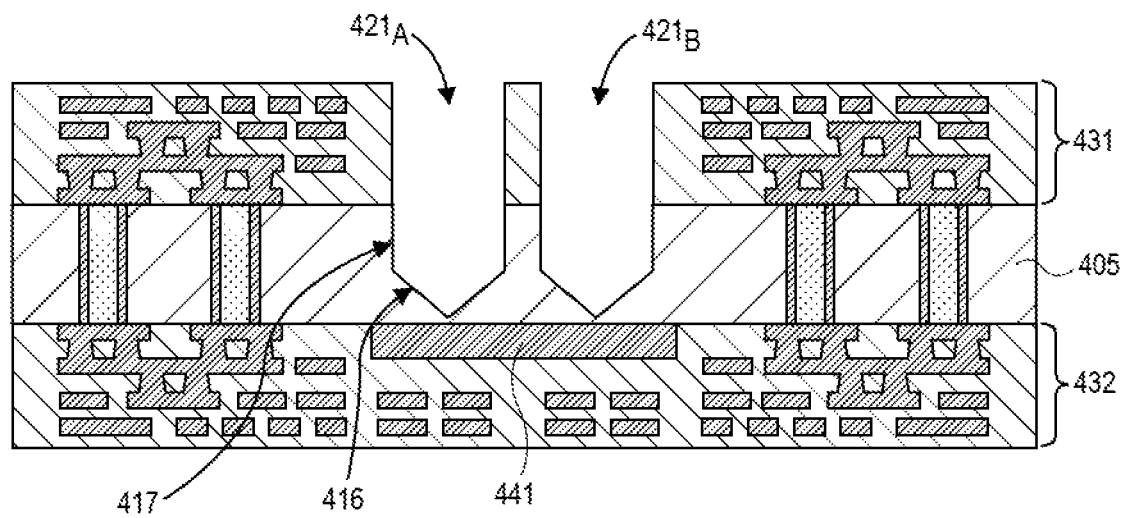

Referring now to FIG. 4C, a cross-sectional illustration after magnetic material openings 421 are formed in the voided region 434 is shown, in accordance with an embodiment. In an embodiment, a first opening 421A and a second opening 421B are provided. The first opening 421A and the second opening 421B are positioned above the first trace 441. In an embodiment, the openings 421A and 421B are formed with a drilling process. As such, sidewalls of the openings 421A and 421B may have substantially vertical sidewalls 417 and a tapered bottom surface 416.

In an embodiment, the openings 421A and 421B extend entirely through the first routing layers 431 and into the package core 405. In an embodiment, the openings 421A and 421B do not extend completely through the package core 405. Control of the depth of the openings 421A and 421B is enabled by the precise depth control (e.g., ±50 μm or better, or ±10 μm or better) of the drilling process.

Figure 4D:
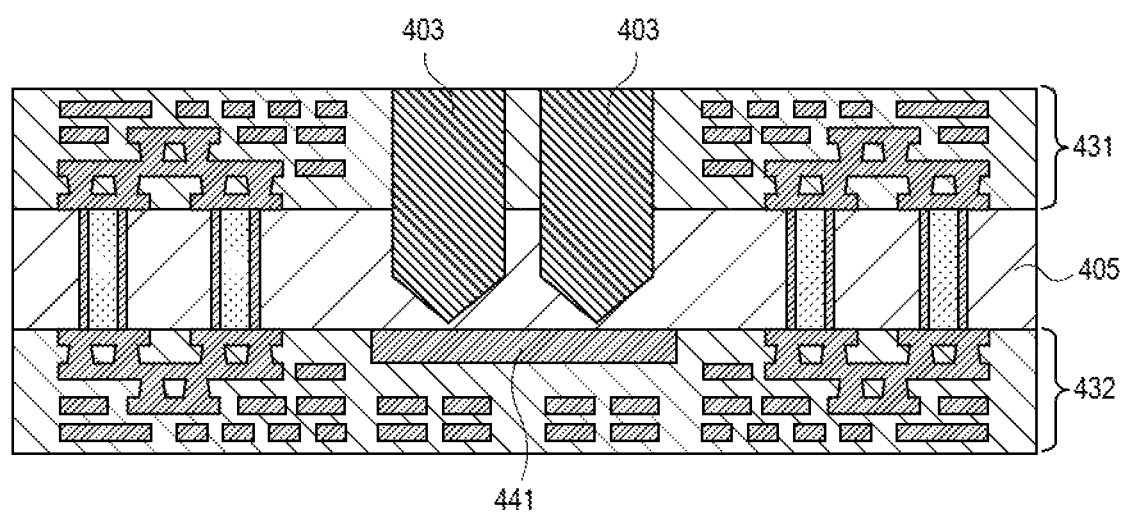

Referring now to FIG. 4D, a cross-sectional illustration after a magnetic material 403 is disposed in the openings 421A and 421B is shown, in accordance with an embodiment. In an embodiment, the magnetic material 403 may be an epoxy with magnetic filler particles, or any other suitable magnetic material that may be disposed into the openings 421A and 421B. Excess magnetic material 403 above the openings 421 may be removed with a grinding process or the like.

Figure 4E:
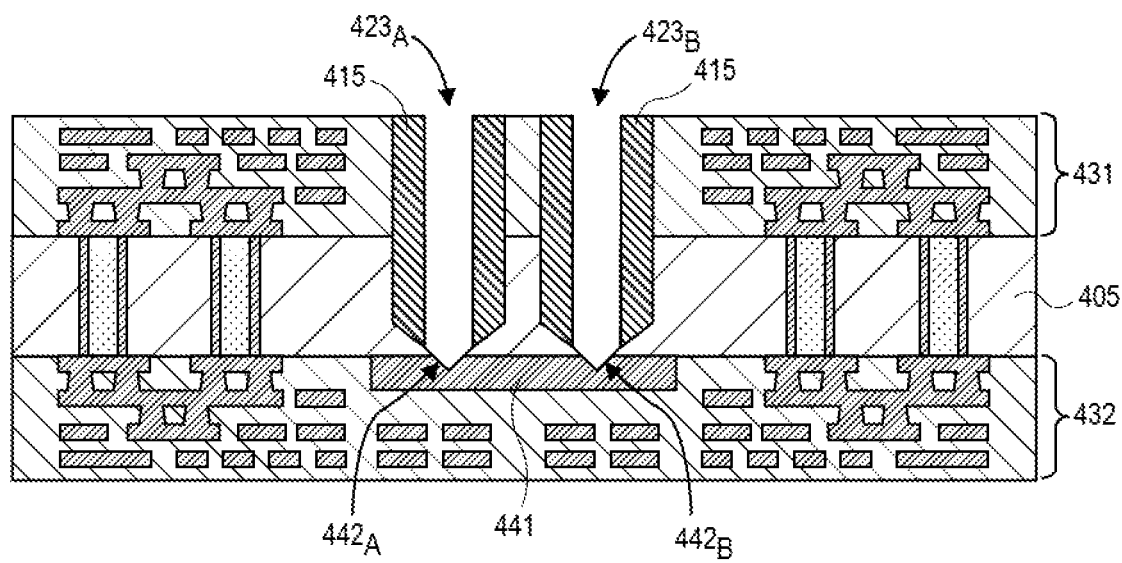

Referring now to FIG. 4E, a cross-sectional illustration after openings 423 are formed through the magnetic material 403 is shown, in accordance with an embodiment. In an embodiment, the openings 423A and 423B may be formed with a drilling process. The openings 423A and 423B drill out a core of the magnetic material 403 to provide magnetic shells 415. In an embodiment, the openings 423A and 423B may extend entirely through the first routing layers 431 and entirely through the package core 405. In an embodiment, the openings 423A and 423B may also extend into the first trace 441. As such, notches 442A and 442B may be provided in the first trace 441. The notches 442A and 442B may be V-shaped as viewed in the cross-section of FIG. 4E. After formation of the openings 423A and 423B a high pressure water rinse may be implemented to clean the interior surface of the magnetic shells 415 to prepare for plating.

Figure 4F:
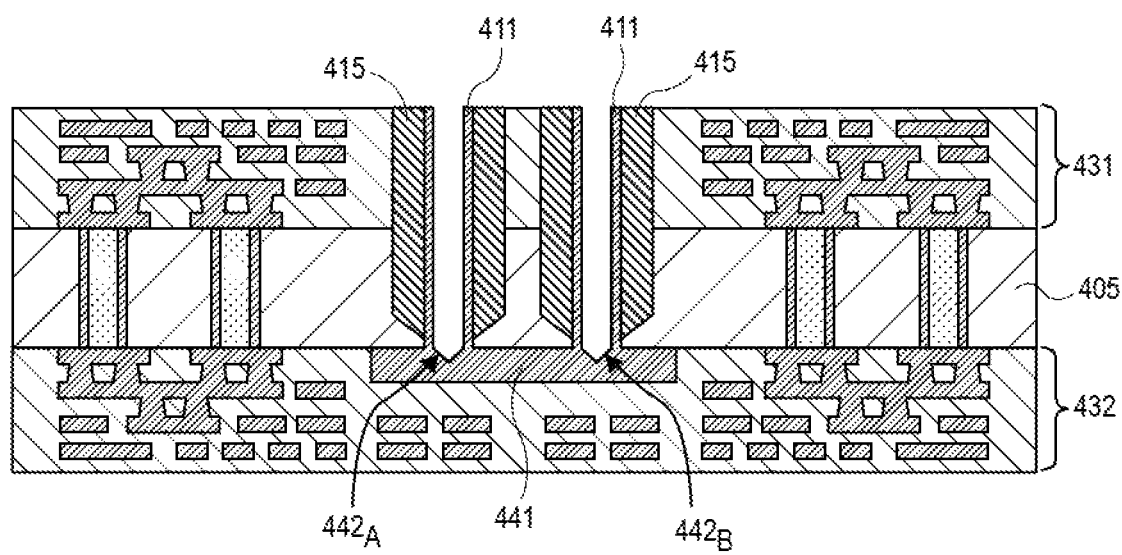

Referring now to FIG. 4F, a cross-sectional illustration after PTHs 411 are provided in the openings 423A and 423B is shown, in accordance with an embodiment. In an embodiment, the PTHs 411 may line the interior surface of the magnetic shells 415. An end portion (i.e., a bottom portion) of the PTHs 411 may directly contact a portion of the package core 405. The PTHs 411 may also conform to the shape of the notches 442A and 442B. As such, the notches 442A and 442B may be present in the final structure.

Figure 4G:
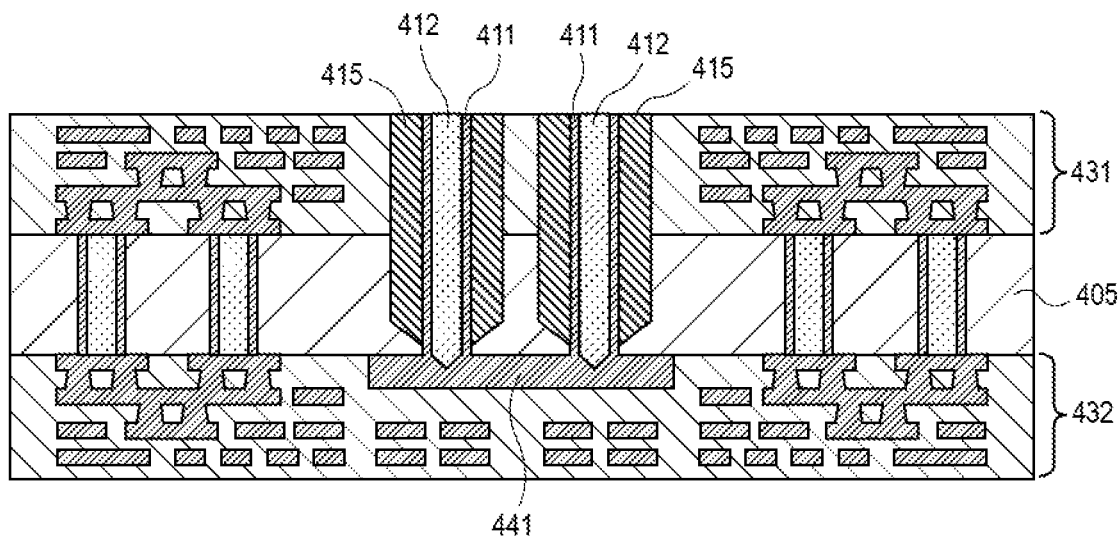

Referring now to FIG. 4G, a cross-sectional illustration after the PTHs 411 are plugged with a plug material 412 is shown, in accordance with an embodiment. In an embodiment, the plug material 412 may be an insulative material. Excess plug material 412 may be recessed with a grinding process or the like. In an embodiment, the plug material 412 conforms to the notches 442 in the first trace 441 to provide a pointed end of the plug material 412.

Figure 4H:
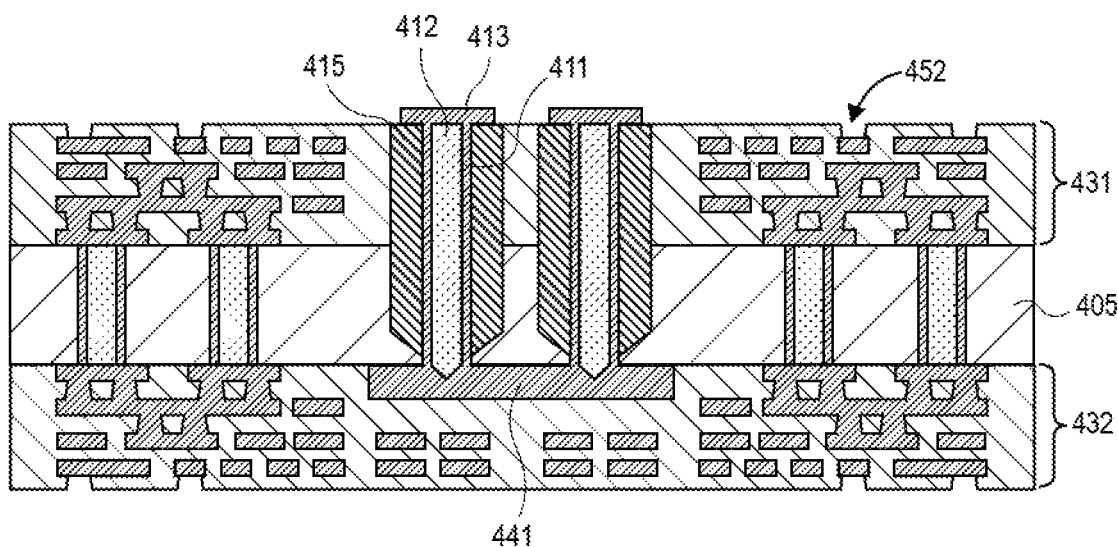

Referring now to FIG. 4H, a cross-sectional illustration after pads 413 are disposed over the PTHs 411 is shown, in accordance with an embodiment. FIG. 4H also illustrates via openings 452 formed into the routing layers 431 and 432. In an embodiment, a desmear process may be used to clean the via openings 452. The pads 413 may protect the magnetic shells 415 during the desmear process.

Figure 4I:
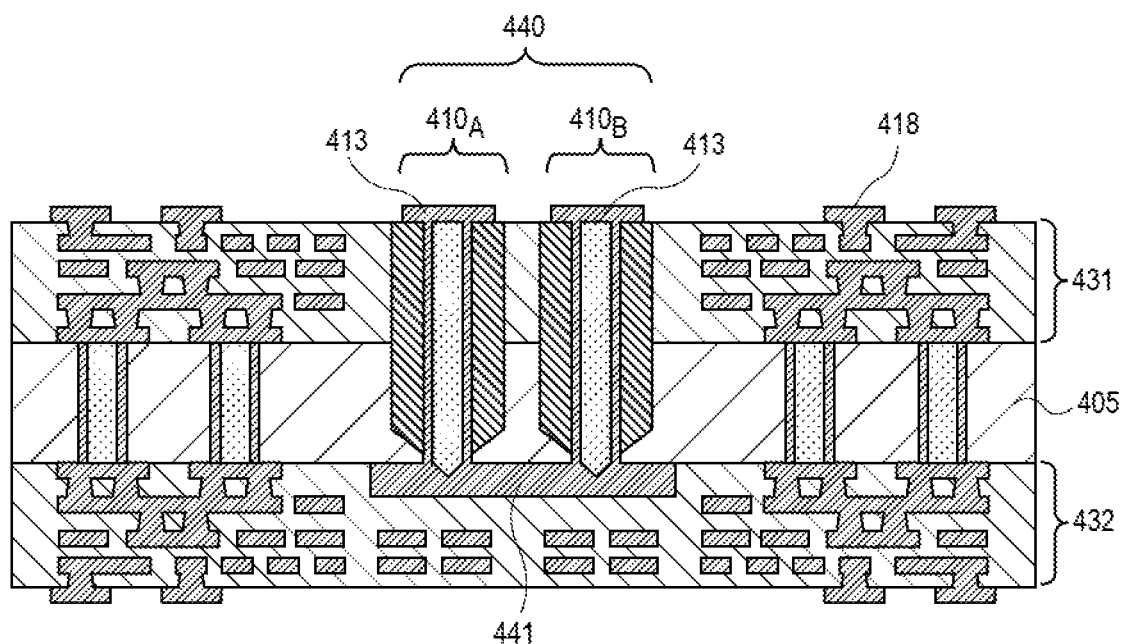

Referring now to FIG. 4I, a cross-sectional illustration after pads 418 are disposed over the top surface and bottom surface of the routing layers 431 and 432 is shown, in accordance with an embodiment. In an embodiment, a solder resist (not shown) may also be disposed over the top and bottom surfaces of the routing layers 431 and 432. In FIG. 4I, the completed inductor loop 440 is shown. The inductor loop 440 comprises first coax MTh structure 410A and second coax MIL structure 410B.

Figure 4J:
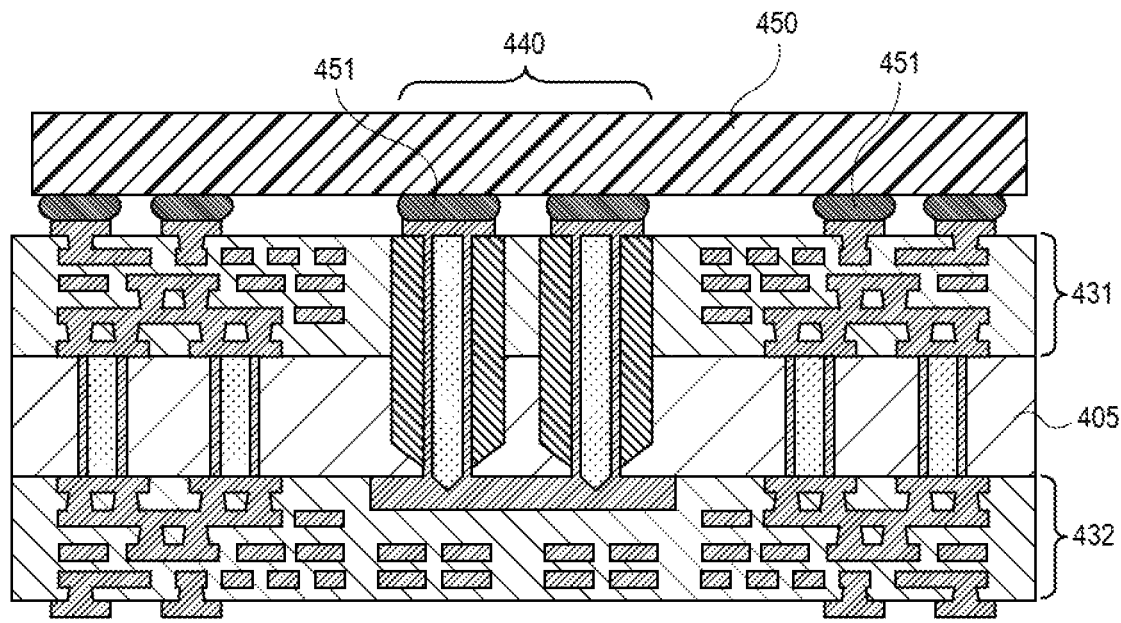

Referring now to FIG. 4J, a cross-sectional illustration after a die 450 is attached is shown, in accordance with an embodiment. In an embodiment, the die may be attached to pads 413 and 418 with interconnects 451. The interconnects 451 may include solder balls or any other first level interconnect (FLI) architecture.

In the illustrated embodiment of FIGS. 4A-4J, a structure similar to the structure in FIG. 3A is shown. However, it is to be appreciated that processing operations similar to those described in FIGS. 4A-4J may also be used to form a structure similar to the structure shown in FIG. 3B. For example, additional coax MTh structures may be formed to provide a plurality of inductor loops, instead of just a single inductor loop.

Figure 5:
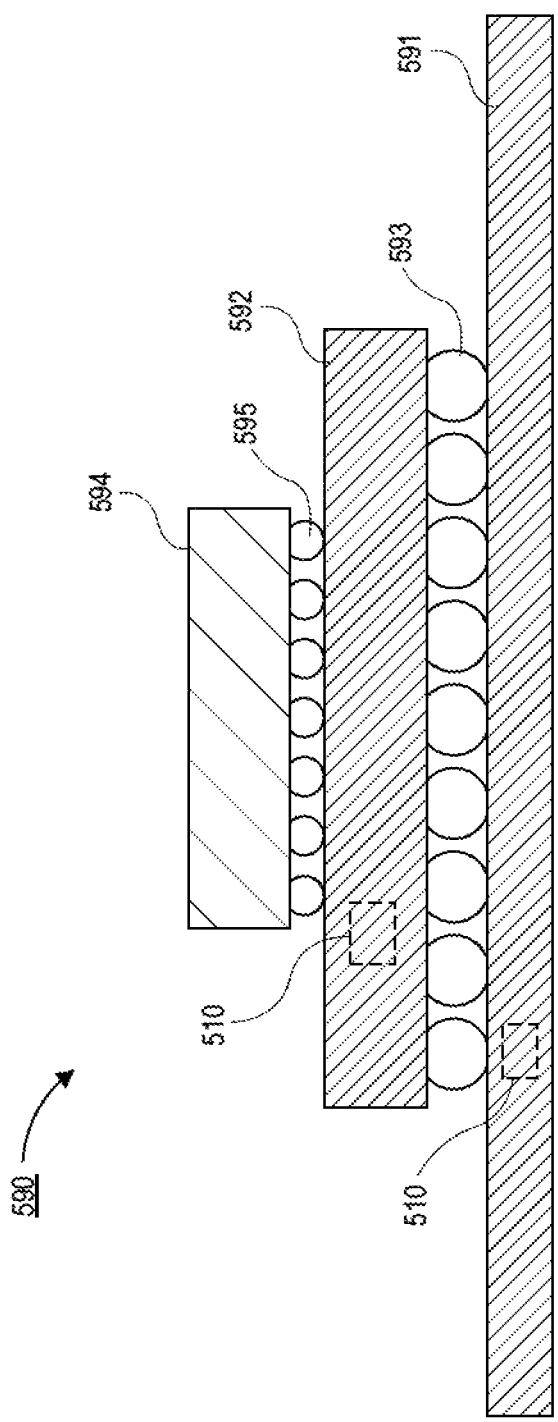
FIG. 5 is a cross-sectional illustration of an electronic system with a package substrate and a board, where coax MIL structures with variable metal shell heights are provided in one or both of the package substrate and the board, in accordance with an embodiment.

Referring now to FIG. 5, a cross-sectional illustration of an electronic system 590 is shown, in accordance with an embodiment. In an embodiment, the electronic system 590 may comprise a board 591 (e.g., a printed circuit board (PCB)) and a package substrate 592 coupled to the board 591. The package substrate 592 may be coupled to the board 591 with any suitable interconnect architecture. For example, interconnects 593 are shown as being solder balls. However, it is to be appreciated that the package substrate 592 may be coupled to the board 591 with other interconnects, such as sockets, or the like. In an embodiment, a die 594 is coupled to the package substrate with FLIs 595.

In an embodiment, one or both of the board 591 and the package substrate 592 may include coax MTh structures 510 (indicated with dashed boxes). The coax MTh structures 510 may be similar to coax MTh structures described in greater detail above. Particularly, the coax MIL structures 510 may include a magnetic shell that surrounds only a portion of a PTH. In a particular embodiment, a bottom surface of the magnetic shell may further comprise a tapered surface that is characteristic of a drilling process.

Figure 6:
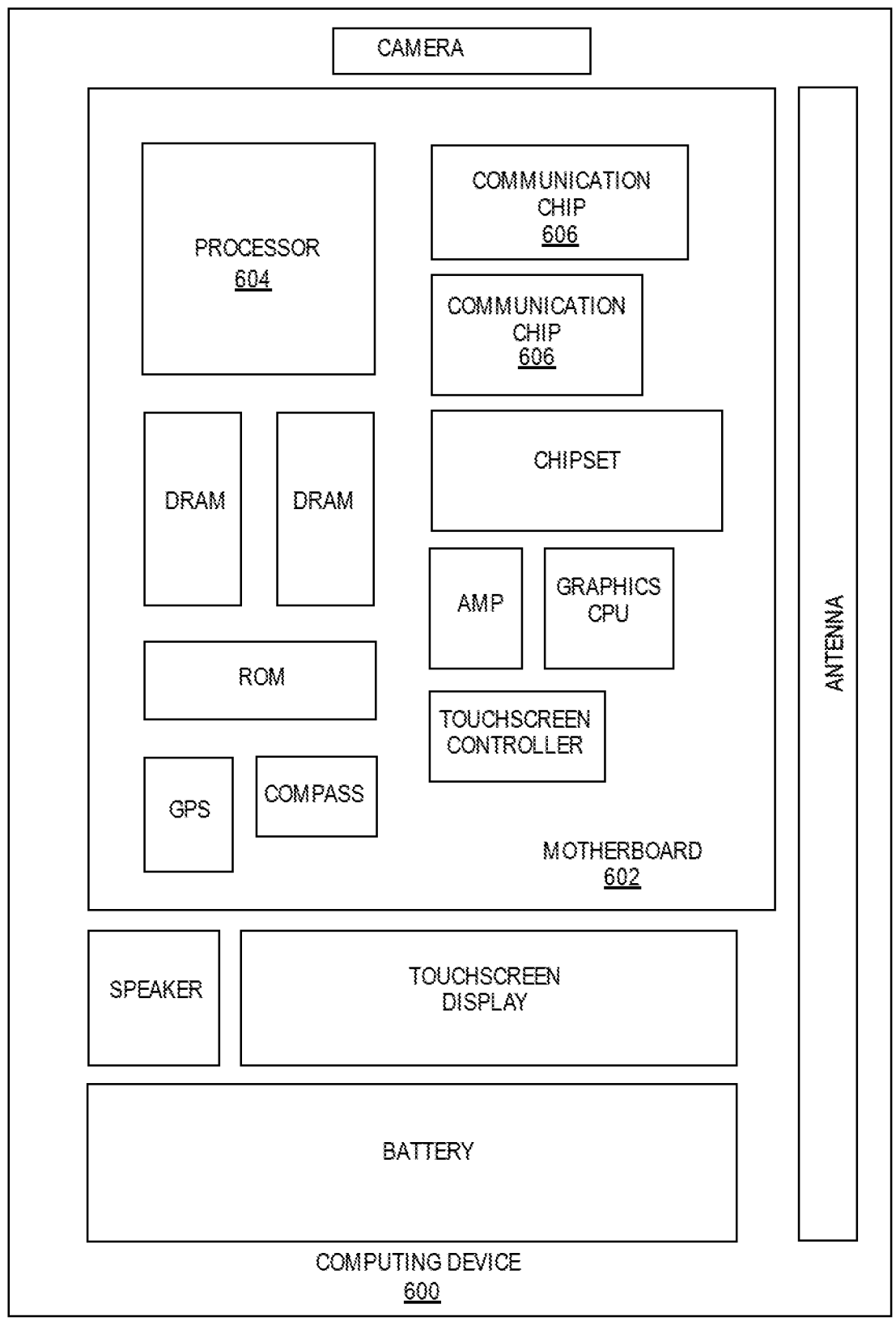
FIG. 6 is a schematic of a computing device built in accordance with an embodiment.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor may be part of an electronic system that comprises coax MTh structures with a magnetic shell that includes a tapered end surface, in accordance with embodiments described herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip may be part of an electronic system that comprises coax MIL structures with a magnetic shell that includes a tapered end surface, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a package core; a plated through hole (PTH) through a thickness of the package core; and a magnetic shell around a perimeter of the PTH, wherein a height of the magnetic shell is less than the thickness of the package core.

Example 2: the electronic package of Example 1, wherein the magnetic shell comprises a substantially vertical sidewall and a bottom surface that is tapered.

Example 3: the electronic package of Example 2, wherein the bottom surface is tapered toward the PTH.

Example 4: the electronic package of Examples 1-3, wherein a top portion of the PTH is surrounded by the magnetic shell, and wherein a bottom portion of the PTH directly contacts the package core.

Example 5: the electronic package of Examples 1-4, wherein an inductance of the PTH is between 1 nH and 100 nH.

Example 6: the electronic package of Examples 1-5, further comprising: a second PTH through the thickness of the package core; and a second magnetic shell around the second PTH, wherein a height of the second magnetic shell is different than the height of the magnetic shell.

Example 7: the electronic package of Example 6, further comprising: a third PTH through the thickness of the package core, wherein an entire sidewall of the third PTH is in direct contact with the package core.

Example 8: the electronic package of Examples 1-7, further comprising: a first plurality of routing layers above the package core; and a second plurality of routing layers below the package core.

Example 9: the electronic package of Examples 1-8, wherein the PTH is plugged with an insulative material.

Example 10: an electronic package, comprising: a package core; a plurality of routing layers above and below the package core; and an inductor embedded in the package core and the plurality of routing layers, wherein the inductor comprises: a first plated through hole (PTH), wherein the first PTH passes through first routing layers above the package core and through the package core; a second PTH, wherein the second PTH passes through the first routing layers above the package core and through the package core; a first magnetic shell around the first PTH; a second magnetic shell around the second PTH; and a trace in a second routing layer below the package core, wherein the trace electrically couples the first PTH to the second PTH.

Example 11: the electronic package of Example 10, wherein a bottom surface of the first magnetic shell and a bottom surface of the second magnetic shell are tapered.

Example 12: the electronic package of Example 10 or Example 11, wherein the trace in the second routing layer comprises a first notch below the first PTH and a second notch below the second PTH.

Example 13: the electronic package of Examples 10-12, wherein a thickness of the trace in the second routing layer is greater than a thickness of other traces in the second routing layer.

Example 14: the electronic package of Example 13, wherein the thickness of the trace in the second routing layer is approximately 30 µm or greater.

Example 15: the electronic package of Examples 10-14, wherein a height of the first magnetic shell is smaller than a height of the first PTH, and wherein a height of the second magnetic shell is smaller than a height of the second PTH.

Example 16: the electronic package of Examples 10-15, wherein the inductor further comprises: a third PTH, wherein the third PTH passes through the first routing layers above the package core and through the package core; a fourth PTH, wherein the fourth PTH passes through the first routing layers above the package core and through the package core; a third magnetic shell around the third PTH; a fourth magnetic shell around the fourth PTH; a second trace in the second routing layer below the package core, wherein the second trace electrically couples the third PTH to the fourth PTH; and a third trace above the package core, wherein the third trace electrically couples the second PTH to the third PTH.

Example 17: the electronic package of Example 16, wherein bottom surfaces of the third magnetic shell and the fourth magnetic shell are tapered.

Example 18: the electronic package of Example 16, wherein the trace in the second routing layer comprises a first notch below the first PTH and a second notch below the second PTH, and wherein the second trace in the second routing layer comprises a third notch below the third PTH and a fourth notch below the fourth PTH.

Example 19: the electronic package of Example 16, wherein the first magnetic shell, the second magnetic shell, the third magnetic shell, and the fourth magnetic shell have a uniform height.

Example 20: the electronic package of Examples 10-19, further comprising: a die electrically coupled to the inductor.

Example 21: a method of forming an inductor in an electronic package, comprising: providing a package core; drilling a first hole with a first diameter into the package core, wherein a bottom of the first hole is V-shaped; filling the first hole with a magnetic material; drilling a second hole with a second diameter through the magnetic material and through an entire thickness of the package core, wherein the second diameter is smaller than the first diameter; and plating a conductive layer along sidewalls of the second hole.

Example 22: the method of Example 21, further comprising: plugging the interior of the second hole with an insulative layer after forming the conductive layer along the sidewalls of the second hole; and forming a conductive pad above and below the conductive layer.

Example 23: an electronic system, comprising: a board; and an electronic package coupled to the board, wherein the electronic package comprises: a package core; a plated through hole (PTH) through a thickness of the package core; and a magnetic shell around a perimeter of the PTH, wherein a height of the magnetic shell is less than the thickness of the package core.

Example 24: the electronic system of Example 23, further comprising: a die electrically coupled to the electronic package.

Example 25: the electronic system of Example 23 or Example 24, wherein the magnetic shell comprises a substantially vertical sidewall and a bottom surface that is tapered.

What is claimed is:

1. An electronic package, comprising:
    a package core;
    a plated through hole (PTH) through a thickness of the package core; and
    a magnetic shell around a perimeter of the PTH, wherein a height of the magnetic shell is less than the thickness of the package core, wherein the magnetic shell comprises a vertical sidewall and a bottom surface that is tapered, and wherein the PTH is plugged with an insulative material.

2. The electronic package of claim 1, wherein the bottom surface is tapered toward the PTH.

3. The electronic package of claim 1, wherein a top portion of the PTH is surrounded by the magnetic shell, and wherein a bottom portion of the PTH directly contacts the package core.

4. The electronic package of claim 1, wherein an inductance of the PTH is between 1 nH and 100 nH.

5. The electronic package of claim 1, further comprising:
    a second PTH through the thickness of the package core; and
    a second magnetic shell around the second PTH, wherein a height of the second magnetic shell is different than the height of the magnetic shell.

6. The electronic package of claim 5, further comprising:
    a third PTH through the thickness of the package core, wherein an entire sidewall of the third PTH is in direct contact with the package core.

7. The electronic package of claim 1, further comprising:
    a first plurality of routing layers above the package core; and
    a second plurality of routing layers below the package core.

8. An electronic package, comprising:
    a package core;
    a plurality of routing layers above and below the package core; and
    an inductor embedded in the package core and the plurality of routing layers, wherein the inductor comprises:
        a first plated through hole (PTH), wherein the first PTH passes through first routing layers above the package core and through the package core;
        a second PTH, wherein the second PTH passes through the first routing layers above the package core and through the package core;
        a first magnetic shell around the first PTH, wherein the magnetic shell comprises a vertical sidewall and a bottom surface that is tapered;
        a second magnetic shell around the second PTH;

a trace in a second routing layer below the package core, wherein the trace electrically couples the first PTH to the second PTH;

a third PTH, wherein the third PTH passes through the first routing layers above the package core and through the package core;

a fourth PTH, wherein the fourth PTH passes through the first routing layers above the package core and through the package core;

a third magnetic shell around the third PTH;

a fourth magnetic shell around the fourth PTH;

a second trace in the second routing layer below the package core, wherein the second trace electrically couples the third PTH to the fourth PTH; and a third trace above the package core, wherein the third trace electrically couples the second PTH to the third PTH.

9. The electronic package of claim 8, wherein a bottom surface of the second magnetic shell is tapered.

10. The electronic package of claim 8, wherein the trace in the second routing layer comprises a first notch below the first PTH and a second notch below the second PTH.

11. The electronic package of claim 8, wherein a thickness of the trace in the second routing layer is greater than a thickness of other traces in the second routing layer.

12. The electronic package of claim 11, wherein the thickness of the trace in the second routing layer is approximately 30um or greater.

13. The electronic package of claim 8, wherein a height of the first magnetic shell is smaller than a height of the first PTH, and wherein a height of the second magnetic shell is smaller than a height of the second PTH.

14. The electronic package of claim 8, wherein bottom surfaces of the third magnetic shell and the fourth magnetic shell are tapered.

15. The electronic package of claim 8, wherein the trace in the second routing layer comprises a first notch below the first PTH and a second notch below the second PTH, and wherein the second trace in the second routing layer comprises a third notch below the third PTH and a fourth notch below the fourth PTH.

16. The electronic package of claim 8, wherein the first magnetic shell, the second magnetic shell, the third magnetic shell, and the fourth magnetic shell have a uniform height.

17. The electronic package of claim 8, further comprising:
a die electrically coupled to the inductor.

18. An electronic package, comprising:
a package core;
a plated through hole (PTH) through a thickness of the package core;
a magnetic shell around a perimeter of the PTH, wherein a height of the magnetic shell is less than the thickness of the package core;
a second PTH through the thickness of the package core;
a second magnetic shell around the second PTH, wherein a height of the second magnetic shell is different than the height of the magnetic shell; and
a third PTH through the thickness of the package core, wherein an entire sidewall of the third PTH is in direct contact with the package core.

19. An electronic package, comprising:
a package core;
a plated through hole (PTH) through a thickness of the package core; and
a magnetic shell around a perimeter of the PTH, wherein a height of the magnetic shell is less than the thickness of the package core, wherein the magnetic shell comprises a vertical sidewall and a bottom surface that is tapered, and wherein an inductance of the PTH is between 1 nH and 100 nH.

* * * * *